(12) United States Patent
Hino et al.

(10) Patent No.: US 8,853,695 B2
(45) Date of Patent: Oct. 7, 2014

(54) THIN FILM TRANSISTOR SUBSTRATE INCLUDING SOURCE-DRAIN ELECTRODES FORMED FROM A NITROGEN-CONTAINING LAYER OR AN OXYGEN/NITROGEN-CONTAINING LAYER

(75) Inventors: Aya Hino, Kobe (JP); Hiroshi Gotou, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 281 days.

(21) Appl. No.: 12/444,267

(22) PCT Filed: Oct. 12, 2007

(86) PCT No.: PCT/JP2007/069995
§ 371 (c)(1),
(2), (4) Date: Apr. 3, 2009

(87) PCT Pub. No.: WO2008/047726
PCT Pub. Date: Apr. 24, 2008

(65) Prior Publication Data
US 2010/0207121 A1 Aug. 19, 2010

(30) Foreign Application Priority Data
Oct. 13, 2006 (JP) ................................. 2006-280532

(51) Int. Cl.
| | | |
|---|---|---|
| *H01L 31/00* | (2006.01) | |
| *H01L 29/45* | (2006.01) | |
| *H01L 29/66* | (2006.01) | |
| *H01L 23/532* | (2006.01) | |
| *H01L 29/49* | (2006.01) | |
| *H01L 27/12* | (2006.01) | |

(52) U.S. Cl.
CPC .......... *H01L 29/458* (2013.01); *H01L 29/4908* (2013.01); *H01L 29/66765* (2013.01); *H01L 23/53233* (2013.01); *H01L 27/124* (2013.01)
USPC .......... 257/57; 257/59; 257/72; 257/E21.411; 257/E33.064; 438/30; 438/259; 438/261; 438/264

(58) Field of Classification Search
CPC ....................................................... H01L 27/124
USPC ................ 257/57, 59, 72, E21.411, E33.064; 438/30, 259, 261, 264; 359/43, 59, 67
See application file for complete search history.

(56) References Cited

U.S. PATENT DOCUMENTS 5,345,324 A * 9/1994 Koseki et al. ................... 349/44
5,514,909 A 5/1996 Yamamoto et al.
(Continued)

FOREIGN PATENT DOCUMENTS

JP  63 308384     12/1988
JP  63308384 A  * 12/1988  ............. H01L 29/78
(Continued)

OTHER PUBLICATIONS

U.S. Appl. No. 12/681,542, filed Apr. 2, 2010, Ochi, et al.
(Continued)

*Primary Examiner* — Kimberly Rizkallah
*Assistant Examiner* — Alexander Belousov
(74) *Attorney, Agent, or Firm* — Oblon, Spivak, McClelland, Maier & Neustadt, L.L.P.

(57) ABSTRACT

A substrate supporting thin film transistors thereon, each including a semiconductor layer and source-drain electrodes, wherein the source-drain electrodes are formed from a nitrogen-containing layer or oxygen/nitrogen-containing layer and a thin film of pure copper or copper alloy. The nitrogen-containing layer or oxygen/nitrogen-containing layer has respectively part or all of its nitrogen or part or all of its oxygen or nitrogen connected to silicon in the semiconductor layer of the thin film transistor, and the thin film of pure copper or copper alloy is connected to the semiconductor layer of said thin film transistor through the nitrogen-containing layer or oxygen/nitrogen-containing layer.

5 Claims, 7 Drawing Sheets

(56) References Cited

U.S. PATENT DOCUMENTS

| | | | |
|---|---|---|---|
| 5,629,222 A * | 5/1997 | Yamazaki et al. | 438/259 |
| 5,966,606 A * | 10/1999 | Ono | 438/303 |
| 6,033,542 A | 3/2000 | Yamamoto et al. | |
| 6,096,438 A | 8/2000 | Takagi et al. | |
| 6,218,206 B1 | 4/2001 | Inoue et al. | |
| 6,252,247 B1 | 6/2001 | Sakata et al. | |
| 7,098,539 B2 | 8/2006 | Gotoh et al. | |
| 7,154,180 B2 | 12/2006 | Gotoh et al. | |
| 7,262,085 B2 | 8/2007 | Gotoh et al. | |
| 7,365,810 B2 | 4/2008 | Gotoh et al. | |
| 7,411,298 B2 * | 8/2008 | Kawakami et al. | 257/741 |
| 2003/0047812 A1 | 3/2003 | Hagihara et al. | |
| 2003/0117539 A1 * | 6/2003 | Hwang et al. | 349/43 |
| 2004/0041958 A1 | 3/2004 | Hwang et al. | |
| 2004/0125257 A1 | 7/2004 | Chae et al. | |
| 2004/0126608 A1 | 7/2004 | Gotoh et al. | |
| 2004/0151025 A1 * | 8/2004 | Ngo et al. | 365/185.01 |
| 2005/0079662 A1 * | 4/2005 | Miki | 438/200 |
| 2006/0091792 A1 | 5/2006 | Kugimiya et al. | |
| 2006/0180250 A1 | 8/2006 | Kugimiya et al. | |
| 2006/0181198 A1 | 8/2006 | Gotoh et al. | |
| 2006/0189047 A1 | 8/2006 | Yamazaki et al. | |
| 2006/0199357 A1 * | 9/2006 | Wan et al. | 438/482 |
| 2006/0237849 A1 | 10/2006 | Gotoh et al. | |
| 2006/0275618 A1 | 12/2006 | Kugimiya et al. | |
| 2007/0040173 A1 | 2/2007 | Kugimiya et al. | |
| 2007/0278497 A1 | 12/2007 | Kawakami et al. | |
| 2008/0081532 A1 | 4/2008 | Okuno | |
| 2008/0121522 A1 | 5/2008 | Ehira et al. | |
| 2008/0223718 A1 | 9/2008 | Takagi et al. | |
| 2008/0315203 A1 | 12/2008 | Hino et al. | |
| 2009/0001373 A1 | 1/2009 | Ochi et al. | |
| 2009/0004490 A1 | 1/2009 | Gotou et al. | |
| 2009/0011261 A1 | 1/2009 | Gotou | |
| 2010/0044717 A1 * | 2/2010 | Choi et al. | 257/72 |

FOREIGN PATENT DOCUMENTS

| | | |
|---|---|---|
| JP | 7 66423 | 3/1995 |
| JP | 7-326756 | 12/1995 |
| JP | 11 283934 | 10/1999 |
| JP | 11 284195 | 10/1999 |
| JP | 11 337976 | 12/1999 |
| JP | 2001 196371 | 7/2001 |
| JP | 2002 353222 | 12/2002 |
| JP | 2003 273109 | 9/2003 |
| JP | 2004 133422 | 4/2004 |
| JP | 2004 212940 | 7/2004 |
| JP | 2004 214606 | 7/2004 |
| JP | 2005 166757 | 6/2005 |
| JP | 2006 80495 | 3/2006 |
| TW | 574584 | 2/2004 |
| TW | 200418148 | 9/2004 |
| TW | 200628952 | 8/2006 |
| TW | 200630748 | 9/2006 |

OTHER PUBLICATIONS

U.S. Appl. No. 12/376,863, filed Feb. 9, 2009, Hino, et al.
U.S. Appl. No. 12/312,907, filed Jun. 1, 2009, Gotou, et al.
U.S. Appl. No. 12/517,362, filed Jun. 3, 2009, Hino, et al.
U.S. Appl. No. 12/528,008, filed Aug. 20, 2009, Gotou, et al.
U.S. Appl. No. 12/812,913, filed Jul. 14, 2010, Ochi, et al.
U.S. Appl. No. 12/918,727, filed Aug. 20, 2010, Miki, et al.
U.S. Appl. No. 12/922,764, filed Sep. 15, 2010, Goto, et al.
U.S. Appl. No. 12/922,965, filed Sep. 16, 2010, Nakai, et al.
U.S. Appl. No. 12/936,572, filed Oct. 6, 2010, Kawakami, et al.
U.S. Appl. No. 12/999,034, filed Dec. 14, 2010, Kawakami, et al.
U.S. Appl. No. 13/056,444, filed Jan. 28, 2011, Onishi, et al.
U.S. Appl. No. 13/144,716, filed Jul. 15, 2011, Goto, et al.
U.S. Appl. No. 13/254,316, filed Sep. 1, 2011, Kobayashi, et al.
U.S. Appl. No. 13/581,436, filed Aug. 27, 2012, Iwasaki, et al.
U.S. Appl. No. 13/320,673, filed Nov. 15, 2011, Tanifuji, et al.
U.S. Appl. No. 13/387,522, filed Jan. 27, 2012, Goto, et al.
U.S. Appl. No. 13/387,557, filed Jan. 27, 2012, Maeda, et al.
Japanese Office Action issued Mar. 27, 2012 in patent application No. 2008-215448 with English translation.
Taiwanese Office Action issued Sep. 23, 2011, in Patent Application No. 096138515.
U.S. Appl. No. 13/122,937, filed Apr. 6, 2011, Nanbu, et al.
U.S. Appl. No. 13/126,126, filed Apr. 26, 2011, Ochi, et al.

* cited by examiner

THIN FILM TRANSISTOR SUBSTRATE INCLUDING SOURCE-DRAIN ELECTRODES FORMED FROM A NITROGEN-CONTAINING LAYER OR AN OXYGEN/NITROGEN-CONTAINING LAYER

TECHNICAL FIELD

The present invention relates to a thin film transistor substrate to be used for liquid crystal displays, semiconductors, and optical parts, and also to a display device. More particularly, the present invention relates to a novel thin film transistor substrate that permits the source-drain electrodes to be connected directly to the semiconductor layer of the thin film transistors.

BACKGROUND ART

Liquid crystal displays are used in various fields ranging from small portable telephones to large television sets exceeding 30 inches in size. They are classified into those of simple matrix type and those of active matrix type. The latter have thin film transistors (TFT for short hereinafter) as the switching elements and find general use because of their high definition image quality and their ability to reproduce high-speed animations.

Figure 1:
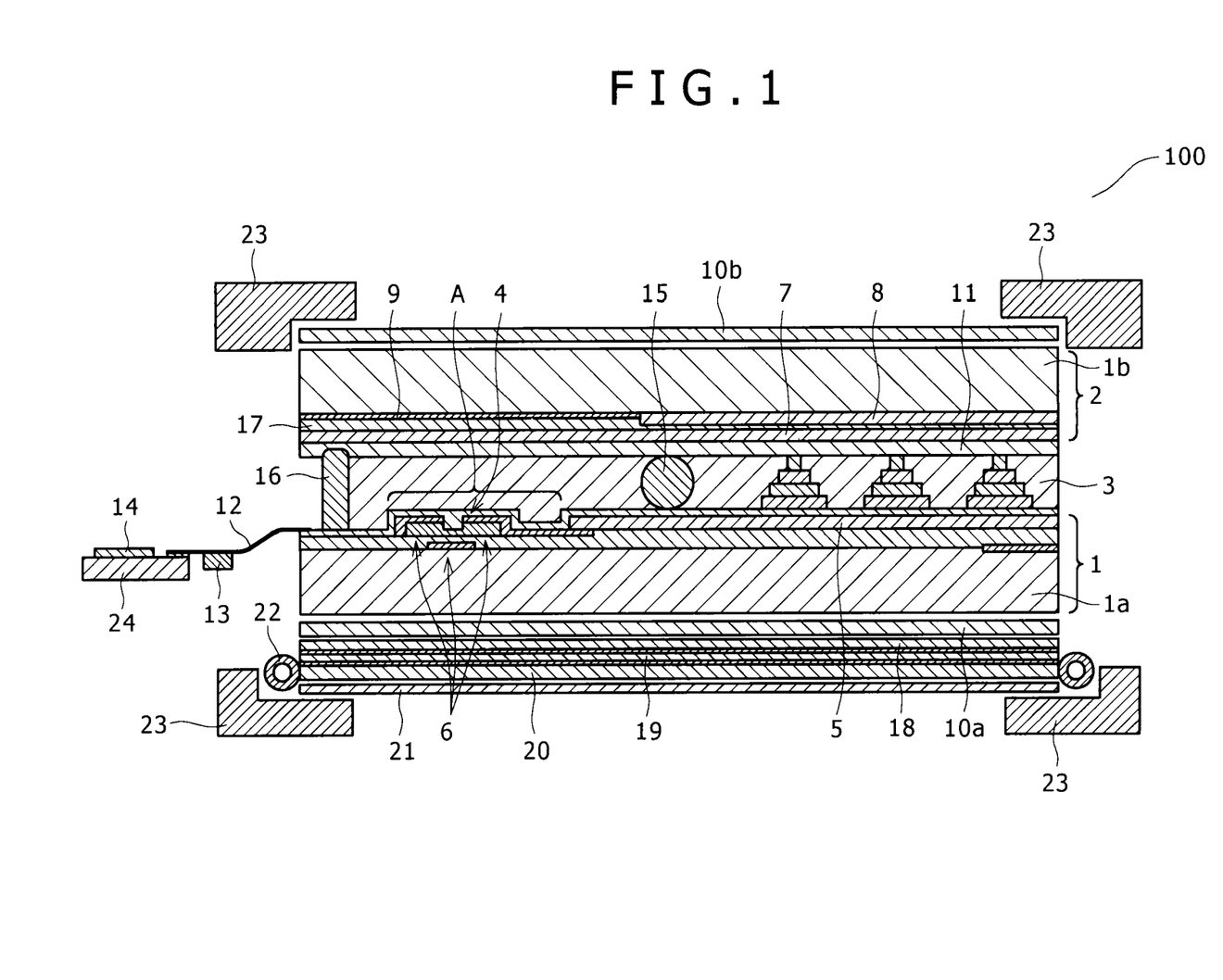
FIG. 1 is a schematic enlarged sectional view showing the structure of a typical liquid crystal panel to which an amorphous silicon TFT substrate is applied.

The following is a description of the structure and working principle of a typical liquid crystal display used for liquid crystal displays of active matrix type, which is given with reference to FIG. 1. The liquid crystal display has a TFT substrate with an active semiconductor layer of hydrogenated amorphous silicon. (The TFT substrate may occasionally be referred to as an amorphous silicon TFT substrate hereinafter.)

As shown in FIG. 1, the liquid crystal display panel 100 consists of a TFT substrate 1, an opposite substrate 2 facing the TFT substrate 1, and a liquid crystal layer 3 (as a light modulating layer) held between the two substrates. The TFT substrate 1 is an insulating glass plate 1a supporting thereon TFTs 4, transparent pixel electrodes 5, and wiring 6 such as scanning lines and signal lines. The transparent pixel electrodes 5 are formed from ITO film. (ITO is a mixture of indium oxide $In_2O_3$ and about 10 mass % tin oxide SnO.) The TFT substrate is connected to a driver circuit 13 and a control circuit 14 through a TAB tape 12.

The opposite substrate 2 is an insulating glass plate 1b, which has a common electrode 7 formed over the entire surface thereof facing the TFT substrate 1, color filters 8 opposite to the transparent pixel electrodes 5, and light shielding films 9 opposite to the TFTs 4 and the wiring 6 on the TFT substrate 1. The opposite substrate 2 additionally has an alignment layer 11 to orient in a desired direction the liquid crystal molecules (not shown) contained in the liquid crystal layer 3.

The TFT substrate 1 and the opposite substrate 2 have polarizers 10a and 10b, respectively, on their outer sides (opposite to the liquid crystal layer 3).

The liquid crystal panel 100 is designed such that the liquid crystal molecules in the liquid crystal layer 3 are properly oriented by the electric field generated between the opposite substrate 2 and the transparent pixel electrodes 5 and the oriented molecules modulate the light passing through the liquid crystal layer 3. In this way the amount of light passing through the opposite substrate 2 is controlled to produce images.

Figure 2:
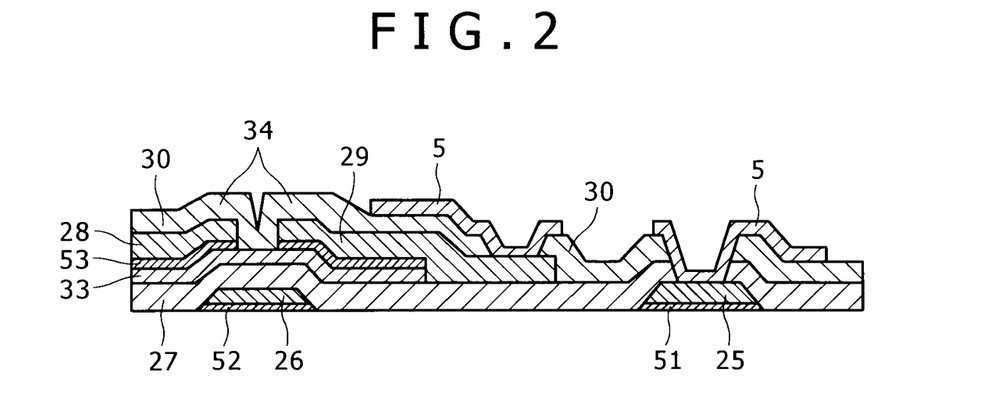
FIG. 2 is a schematic sectional view showing the structure of a conventional typical amorphous silicon TFT substrate.

The following is a description of the structure and working principle of a conventional amorphous silicon TFT substrate used for liquid crystal panels, which is given with reference to FIG. 2. FIG. 2 is an enlarged view showing part A in FIG. 1.

There is shown in FIG. 2 the scanning line (gate thin film wiring) 25 formed on the glass plate (not shown). Part of the scanning line 25 functions as the gate electrode 26 that turns on and off the TFT. The gate electrode 26 is covered with the gate insulating film 27 of silicon nitride. There is also shown the signal line 34 (or the source-drain wiring) that intersects with the scanning line 25, with the gate insulating film 27 interposed between them. Part of the signal line 34 functions as the TFT source electrode 28. On the gate insulating film 27 are sequentially formed the amorphous silicon channel film 33 of active semiconductor, the signal line 34 (or the source-drain wiring), and the interlayer insulating film 30 of silicon nitride (as a protective film). The liquid crystal panel mentioned above is called that of bottom gate type.

The amorphous silicon channel film 33 is composed of a doped phase (or n-layer) containing P (phosphorus) and an intrinsic layer (or i-layer or undoped layer) not containing P. In the pixel region above the gate insulating film 27 is the transparent electrode 5 of ITO film ($In_2O_3$ containing SnO). The drain electrode 29 of the TFT is in direct contact with the transparent pixel electrode 5 for electrical connection.

The TFT 4 is turned on as the gate electrode 26 is supplied with gate voltage through the scanning line 25. The driving voltage, which has previously been supplied to the signal line 34, is supplied from the source electrode 28 to the transparent pixel electrode 5 through the drain electrode 29. As the transparent pixel electrode 5 is supplied with driving voltage at a certain level, an electric potential occurs between the transparent pixel electrode 5 and the opposite electrode 2 to orient the liquid crystal molecules in the liquid crystal layer 3 (for light modulation), as explained above with reference to FIG. 1.

The TFT substrate 1 conventionally has the source-drain wiring (electrically connected to the source-drain electrodes) and the scanning line 25 (electrically connected to the gate electrode 26) formed from thin film of Al-based alloy (such as Al—Nd) which is easy to work. The Al-based alloy, however, poses a problem with RC delay (slow transmission of electric signals through the wiring) as the liquid crystal display becomes larger than before. Thus, there is an increasing demand for replacement of Al-based alloy with a low-resistance material. Now, pure copper or Cu—Ni alloy is attracting attention which has a lower electrical resistance than Al-based alloy containing 2.0 at % of Nd.

The wiring of pure copper needs a barrier metal layer formed thereunder. In the case where the source-drain wiring 34, the gate electrode 26, and the scanning line 25 are formed from pure copper, it is necessary to form thereunder the respective barrier metal layers 51, 52, and 53 of high-melting metal, such as Mo, Cr, Ti, and W, as shown in FIG. 2. Patent Documents 1 to 6 disclose technologies to form the source-drain electrode with such a barrier metal layer. The disclosure is concerned typically with a dual-layer structure composed of a Mo layer (about 50 nm thick as a lower barrier metal layer) and a pure copper layer or a cooper alloy layer (about 150 nm thick) sequentially formed on top of the other.

The lower barrier metal layer 53 is interposed between the amorphous silicon channel layer 33 and the source-drain wiring 34 of pure copper or copper alloy as shown in FIG. 2. The main reason for this is to prevent mutual diffusion of Si and Cu at the interface between the pure copper thin film and the amorphous silicon channel thin film. (The interface may occasionally be referred simply to as interface.)

To be more precise, the pure copper thin film or copper alloy thin film and the amorphous silicon channel thin film, which are in direct contact with each other, will cause copper to diffuse into silicon and vice versa at the time of heat treatment, such as sintering and annealing, in the last stage of TFT forming. Such diffusion remarkably deteriorates the semiconductor performance, reduces the ON current, increases the OFF current (or leak current that flows while the TFT is turned off), or decreases the switching speed of the TFT. The result is poor TFT characteristics and poor display performance. The mutual diffusion of Cu and Si can be effectively avoided by the lower barrier metal layer 53.

The wiring formed from pure copper or copper alloy may separate from the amorphous silicon channel thin film 33, resulting in disconnection. This is due to poor adhesion between copper and amorphous silicon. Good adhesion is achieved by interposing a lower barrier metal layer 53 between pure copper or copper alloy and the amorphous silicon channel thin film 33.

However, forming the lower barrier metal layer 53 as mentioned above needs, in addition to the film-forming apparatus for the wiring of pure copper or copper alloy, a film-forming apparatus for the barrier metal layer. To be concrete, it is necessary to use a film-forming apparatus equipped with an additional chamber for the barrier metal layer. Such an apparatus may be a cluster tool having more than one film-forming chamber connected to a transfer chamber. The barrier metal layer adds up to production cost and lowers productivity to a nonnegligible extent as the cost of mass-produced liquid crystal displays decreases.

Thus, the lower barrier metal layer raises production cost and lowers productivity because it needs an extra film-forming chamber in addition to the film-forming sputtering apparatus for the gate electrode, source electrode, and drain electrode.

This situation has aroused interest in a new electrode material that eliminates the necessity of barrier metal layer and permits the source-drain electrodes to be connected directly to the semiconductor layer such as amorphous silicon channel thin film. Patent Documents 7 to 11 disclose technologies that do not need the barrier metal layer when pure aluminum or aluminum alloy is used for wiring, although they are not concerned with pure copper or copper alloy.

The foregoing problem is encountered in not only liquid crystal display devices but also amorphous silicon TFT substrates in common. It is also encountered in TFT substrates with semiconductor layers of polycrystalline silicon.

Patent Document 1:
  Japanese Patent Laid-open No. Hei-7-66423
Patent Document 2:
  Japanese Patent Laid-open No. 2001-196371
Patent Document 3:
  Japanese Patent Laid-open No. 2002-353222
Patent Document 4:
  Japanese Patent Laid-open No. 2004-133422
Patent Document 5:
  Japanese Patent Laid-open No. 2004-212940
Patent Document 6:
  Japanese Patent Laid-open No. 2005-166757
Patent Document 7:
  Japanese Patent Laid-open No. Hei-11-337976
Patent Document 8:
  Japanese Patent Laid-open No. Hei-11-283934
Patent Document 9:
  Japanese Patent Laid-open No. Hei-11-284195
Patent Document 10:
  Japanese Patent Laid-open No. 2004-214606
Patent Document 11:
  Japanese Patent Laid-open No. 2003-273109

DISCLOSURE OF THE INVENTION

The present invention was completed in view of the foregoing. It is an object of the present invention to provide a thin film transistor substrate which has the source-drain wiring connected firmly and directly to the semiconductor layer of TFT and which exhibits good TFT characteristics even though the barrier metal layer is omitted which is usually interposed between the source-drain electrode and the semiconductor layer of TFT.

The gist of the present invention to address the above-mentioned problem resides in a substrate supporting thin film transistors thereon, each having a semiconductor layer and source-drain electrodes, wherein said source-drain electrodes are formed from a nitrogen-containing layer or oxygen/nitrogen-containing layer and a thin film of pure copper or copper alloy, said nitrogen-containing layer or oxygen/nitrogen-containing layer has respectively part or all of its nitrogen or part or all of its oxygen or nitrogen connected to silicon in said semiconductor layer of said thin film transistor, and said thin film of pure copper or copper alloy is connected to said semiconductor layer of said thin film transistor through said nitrogen-containing layer or oxygen/nitrogen-containing layer.

According to a preferred embodiment, the substrate supporting thin film transistors thereon is characterized in that said nitrogen-containing layer contains nitrogen such that the ratio of the number of nitrogen atoms to the number of silicon atoms is no smaller than 0.2 and no larger than 2.0, and said oxygen/nitrogen-containing layer contains oxygen and nitrogen such that the ratio of the total number of oxygen atoms and nitrogen atoms to the number of silicon atoms is no smaller than 0.2 and no larger than 2.0.

According to another preferred embodiment, the substrate supporting thin film transistors thereon is characterized in that said nitrogen-containing layer or oxygen/nitrogen-containing layer has a thickness no smaller than 0.8 mm and no larger than 3.5 nm.

According to another preferred embodiment, the substrate supporting thin film transistors thereon is characterized in that said semiconductor layer of said thin film transistor is formed from amorphous silicon or polycrystalline silicon.

The present invention covers also a display device which is equipped with said substrate supporting thin film transistors thereon.

The thin film transistor substrate according to the present invention which is constructed as mentioned above exhibits good TFT characteristics even though the conventional barrier metal layer is not interposed between the source-drain electrodes and the semiconductor layer of TFT.

According to the present invention, the wiring for the source-drain electrodes may be formed from pure copper or copper alloy containing at least one element selected from the group consisting of Ni, Zn, Mg, Mn, Ir, Ge, Nb, Cr, and rare earth elements.

The thin film transistor substrate of the present invention may be used to produce high-performance display devices efficiently and economically.

DESCRIPTION OF SYMBOLS

1 TFT substrate
2 Opposite electrode
3 Liquid crystal layer
4 Thin film transistor (TFT)
5 Transparent pixel electrode
6 Wiring
7 Common electrode
8 Color filter
9 Light shielding film
10a, 10b Polarizer
11 Alignment layer
12 TAB tape
12 Driver circuit
14 Control circuit
15 Spacer
16 Sealing material
17 Protective film
18 Diffuser
19 Prism sheet
20 Light guide plate
21 Reflector
22 Back light
23 Supporting frame
24 Printed circuit board
25 Scanning line
26 Gate electrode
27 Gate insulating film (Silicon nitride film)
28 Source electrode
29 Drain electrode
28a, 29a Oxygen/nitrogen-containing layer
28b, 29b copper alloy thin film
30 Protective film
33 Amorphous silicon channel film (Active semiconductor film)
34 Signal line (Source-drain wiring)
51, 52, 53 Barrier metal layer
55 Undoped hydrogenate amorphous silicon film (a-Si—H)
56 $n^+$-type hydrogenated amorphous silicon film ($n^+$a-Si—H)
60 Oxygen/nitrogen-containing layer
61 Cu-2.0 at % Nd alloy film
62 Resist
63 Cu-2.0 at % Ni alloy film
100 Liquid crystal display panel

BEST MODE FOR CARRYING OUT THE INVENTION

The present inventors carried out research to develop a new thin film transistor substrate having source-drain electrodes directly connected with the semiconductor layer of TFT. The direct connection permits the thin film transistor to exhibit its good characteristics even though the conventional barrier metal layer is not interposed between the source-drain electrodes and the semiconductor layer.

It was found from the research that the foregoing object is achieved if the wiring for the source-drain electrodes is formed from a nitrogen-containing layer or an oxygen/nitrogen-containing layer and a thin film of pure copper or copper alloy and is constructed such that part or all of nitrogen in the nitrogen-containing layer or part or all of oxygen or nitrogen in the oxygen/nitrogen-containing layer is connected with silicon in the semiconductor layer of the thin film transistor. (In other words, the surface layer of the silicon semiconductor is at least partly oxidized or nitrided.) This finding led to the present invention. Thus, the thin film of copper alloy is connected directly with the semiconductor layer of TFT through the nitrogen-containing layer or oxygen/nitrogen-containing layer.

In this specification, the term "source-drain electrodes" embraces the source-drain electrodes per se and the drain wiring. In other words, the source-drain electrodes according to the present invention is composed integrally of source-drain electrodes and source-drain wiring, so that the source-drain wiring is in contact with the source-drain region.

For convenience' sake in the following description, the "nitrogen-containing layer" or the "oxygen/nitrogen-containing layer" may be collectively referred to as the "nitrogen-oxygen/nitrogen-containing layer". A nitrogen-containing layer formed by nitrogen plasma may be contaminated with some oxygen atoms originating from those adsorbed to the chamber or pipe, and this inevitably results in an oxygen/nitrogen-containing layer. (A detailed description will be given later.) Experiments in Embodiment 1 and Examples 1 to 3 showed that the nitrogen-containing layer contains oxygen. So, the term "oxygen/nitrogen-containing layer" is used herein.

(The Source-Drain Electrodes Used in the Present Invention)

Figure 8:
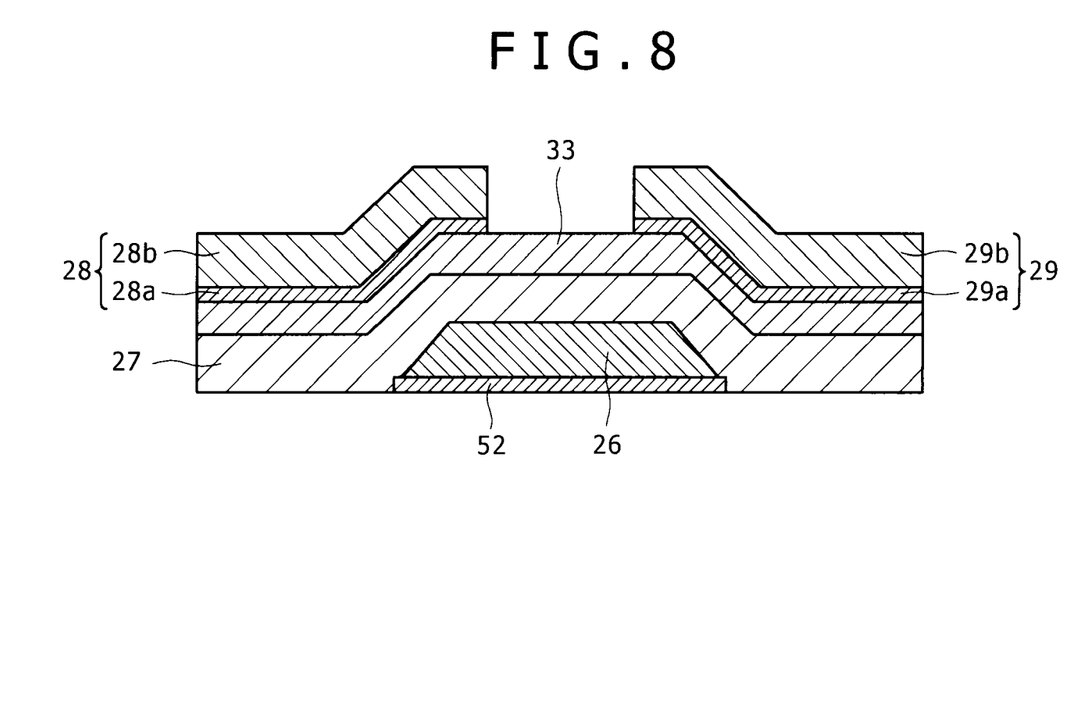
FIG. 8 is a schematic diagram showing the structure of the source-drain electrodes used in the present invention.

According to the present invention, the source-drain electrodes 28 and 29 are composed respectively of the nitrogen-oxygen/nitrogen-containing layers 28a and 29a and the copper alloy thin films 28b and 29b, as shown in FIG. 8. The nitrogen-oxygen/nitrogen-containing layers 28a and 29a are so formed as to cover the semiconductor layer 33 of TFT. Nitrogen atoms in the nitrogen-containing layer or oxygen and nitrogen atoms in the oxygen/nitrogen-containing layer partly or entirely connect with silicon in the semiconductor layer. These oxygen and nitrogen atoms adhere more firmly to copper than silicon, and this firm adhesion prevents the electrodes from peeling after patterning. Moreover, the nitrogen-oxygen/nitrogen-containing layers 28a and 29a function as a barrier that prevents mutual diffusion of copper and silicon at the interface between the copper alloy layers 28a and 29b and the semiconductor layer 33 of TFT. The barrier action is achieved by nitrogen more effectively than oxygen. Therefore, the barrier layer should contain at least nitrogen.

The TFT according to the present invention exhibits good characteristics, as proved in Examples given later, without the barrier metal layer of molybdenum or the like unlike the conventional one. In addition, according to the present invention, the nitrogen-oxygen/nitrogen-containing layer can be formed in a simple manner by plasma process after the semiconductor layer has been formed and before the copper alloy layer is formed, as detailed later, and this obviates installing a special film-forming apparatus for the barrier metal layer unlike the conventional technology.

The following deals with the nitrogen-oxygen/nitrogen-containing layer that characterizes the present invention.

The nitrogen-containing layer exists in such a manner that part or all of nitrogen atoms in it binds with silicon in the semiconductor layer, forming mainly silicon nitride ($Si_xN_{1-x}$). The oxygen/nitrogen-containing layer exists in such a manner that part or all of oxygen and nitrogen atoms in it binds with silicon in the semiconductor layer, forming mainly silicon oxynitride (SiON). The silicon nitride occurs as the surface of the silicon semiconductor layer is nitrided. The silicon oxynitride occurs as the surface of the silicon semiconductor layer combines with nitrogen and oxygen that inevitably enters the process while silicon nitride is being formed.

The nitrogen-containing layer (or silicon nitride) and oxygen/nitrogen-containing layer (or silicon oxynitride) mentioned above are good in adhesion to copper and adheres more firmly to copper alloy than amorphous silicon (a-Si). The silicon nitride and silicon oxynitride are slightly poorer in adhesion than molybdenum which is a typical high-melting metal used for the barrier metal layer. However, their adhesiveness is practically satisfactory in production of liquid crystal panels, and this has been proved by the tape adhesion test mentioned below.

The tape test is a simple method of evaluating adhesion of a film to amorphous silicon. It consists of forming a film on amorphous silicon, cutting the film in a checkerboard pattern at intervals of 1 mm with a cutter, attaching an adhesive tape onto the film, and jerking off the adhesive tape. (The adhesive tape is "Ultra Tape #6570" from ULTRA TAPE Co., Ltd., which is an equivalent of Cellotape® for clean room.) In the tape test, the specimen in direct contact with amorphous silicon was a pure copper film without the nitrogen-oxygen/nitrogen-containing layer, pertaining to Comparative Example 1 given later, and a pure copper layer with the oxygen/nitrogen-containing layer (silicon oxynitride), pertaining to Example 2 given later.

As the result, it was found that a pure copper film with the oxygen/nitrogen-containing layer exhibits better adhesion to amorphous silicon than the conventional pure copper film without the nitrogen-oxygen/nitrogen-containing layer.

The nitrogen-oxygen/nitrogen-containing layer mentioned above should preferably satisfy the following additional conditions.

The nitrogen-containing layer should contain a certain number of nitrogen atoms (N) and a certain number of silicon atoms (Si) such that the maximum ratio of N/Si is no smaller than 0.2 and no larger than 2.0. (This ratio may be referred to as P value.) Likewise, the oxygen/nitrogen-containing layer should contain a certain number of oxygen atoms (O) and nitrogen atoms (N) and a certain number of silicon atoms (Si) such that the maximum ratio of (O+N)/Si is no smaller than 0.2 and no larger than 2.0. (This ratio may be referred to as Q value.) Such specified ratios are necessary for the nitrogen-oxygen/nitrogen-containing layer to exhibit its barrier action effectively without deteriorating the TFT characteristics. The maximum of the P value and Q value should be no smaller than 0.6, preferably no smaller than 0.7.

Since the nitrogen-oxygen/nitrogen-containing layer produces its barrier action owing to its nitrogen atoms rather than its oxygen atoms as mentioned above; therefore, it should contain more nitrogen atoms than oxygen atoms. However, even though it contains oxygen atoms, it has no adverse effect on the present invention so long as the Q value is in the range of 0.2 to 2.0. This is the reason why the Q value is defined as mentioned above.

The lower limit (0.2) of the P value and Q value was established by analogy of the O/Si ratio that is effective in preventing diffusion by the surface oxidation of amorphous silicon. Likewise, the upper limit (2.0) of the P value and Q value was established on the assumption that the maximum O/Si ratio is about 2.0 when $SiO_2$ is formed.

The maximum P value and Q value may be adjusted by regulating the duration of plasma irradiation within 5 seconds to 20 minutes in the step of forming the nitrogen-oxygen/nitrogen-containing layer (mentioned later).

The P value and Q value may be calculated by analyzing the amount of elements (N and Si) in the depthwise direction of the nitrogen-oxygen/nitrogen-containing layer by Rutherford Backscattering Spectrometry.

The nitrogen-oxygen/nitrogen-containing layer should have a thickness no smaller than 0.8 nm and no larger than 3.5 nm. The lower limit (0.8 nm) of the thickness approximately corresponds to the lattice constant of one-atom layer of SiN. This thickness is large enough for the P value or Q value to be no smaller than 0.2. Any thickness for the P value or Q value less than 0.2 is excluded.

The nitrogen-oxygen/nitrogen-containing layer is useful as a barrier layer to prevent mutual diffusion of copper and silicon at the interface between the copper alloy layer and the semiconductor layer of TFT, as mentioned above. It exhibits its good barrier properties if it is formed on the surface of the semiconductor layer of TFT and it has a thickness of about one-atom layer of SiN. However, it deteriorates the TFT characteristics if it is excessively thick. With an adequate thickness within the above-mentioned range, it will not increase in electrical resistance too much to adversely affect the TFT characteristics. An adequate thickness of the nitrogen-oxygen/nitrogen-containing layer should be no larger than 3.0 nm, preferably no larger than 2.5 nm.

The thickness of the nitrogen-oxygen/nitrogen-containing layer may be determined by various physical analytical methods, such as RBS method (mentioned above), XPS (X-ray photoelectron spectroscopy), SIMS (secondary-ion mass spectrometry), and GD-OES (high-frequency glow discharge emission spectroscopic analysis).

The nitrogen-oxygen/nitrogen-containing layer can be formed by nitriding the upper part of the semiconductor layer. The nitriding method is not specifically restricted. Nitriding may be accomplished by (i) plasma treatment, (ii) heating, or (iii) amination.

The method (i) by plasma treatment employs nitrogen gas to form the nitrogen-containing layer or a mixture of nitrogen gas and oxygen gas to form the oxygen/nitrogen-containing layer. Plasma with nitrogen might form an oxygen/nitrogen-containing layer on account of oxygen atoms that inevitably enter the apparatus, as mentioned above. Nitrogen gas and oxygen gas used for plasma treatment may be diluted with inert gas such as argon. Nitrogen and oxygen may be supplied from a plasma source containing nitrogen and oxygen. In this case, the object may be achieved by ion implantation with nitrogen ions or a mixture of nitrogen ions and oxygen ions.

The method (ii) for heating consists of simply heating the silicon semiconductor layer in an atmosphere of nitrogen or a mixture of nitrogen and oxygen. Heating in this manner gives rise to the nitrogen-containing layer or the oxygen-containing layer. Nitrogen gas and oxygen gas used for heating may be diluted with inert gas such as argon.

The method (iii) for amination resorts to photochemical reactions, which cause nitrogen-containing substituent groups, such as amino group ($-NH_3$), to be chemically adsorbed to the surface of the silicon semiconductor. The adsorbed groups are subjected to vapor deposition with copper alloy, so that the nitrogen-containing layer or the oxygen/nitrogen-containing layer is formed as desired.

Other methods than mentioned above include natural diffusion, which is a phenomenon that nitrogen atoms or oxygen atoms present on the surface of the silicon semiconductor diffuse into the copper alloy thin film during formation of the source-drain electrodes, thereby forming the nitrogen-containing layer or the oxygen/nitrogen-containing layer.

The following is a detailed description of the methods (i), (ii), and (iii).

(i) Plasma Nitriding Method

The plasma nitriding method employs plasma. A nitrogen-containing gas for plasma is desirable, as demonstrated in Embodiment and Example 1 given later. The nitrogen-containing gas includes $N_2$, $NH_3$, and $NF_3$. These gases may be used alone or in combination with one another. To be specific, it is desirable to place the semiconductor of TFT near the source of plasma containing nitrogen. The distance between the plasma source and the semiconductor layer varies depending on the kind of plasma and plasma generating conditions (electric power, pressure, temperature, duration of irradiation, and gas composition). It is usually several tens of centimeters. Such plasma is surrounded by high-energy nitrogen atoms, which readily form the nitrogen-oxygen/nitrogen-containing layer on the surface of the semiconductor layer as desired.

Supply of nitrogen from the nitrogen-containing plasma source may be accomplished by ion implantation. Ion implantation accelerates ions by electric fields and accelerated ions can move over a long distance. Therefore, it is not restricted by the distance between the plasma source and the semiconductor layer. Ion implantation should be carried out by application of negative high-voltage pulses to the semiconductor layer placed near the plasma source, so that ions are implanted over the entire surface of the semiconductor layer. Ion implantation may also be carried out by using a special apparatus for ion implantation.

For further improvement in TFT characteristics, the plasma generating conditions (plasma gas pressure and composition and treating temperature) should be controlled as follows so that the nitrogen-oxygen/nitrogen-containing layer has an N/O ratio no smaller than 0.5 (in terms of areal density). The controlled conditions effectively protect the semiconductor layer from oxidation, promote the nitriding reaction, and increase yields. (See Examples given later.)

The treating temperature should be no lower than 300° C. Treatment at temperatures lower than 300° C. retards nitriding reactions and takes a long time to form the nitrogen-oxygen/nitrogen-containing layer that effectively prevents diffusion. Moreover, it promotes oxidizing reaction rather than nitriding reactions, thereby aggravating the TFT characteristics. However, treatment at excessively high temperatures degrades and damages the object semiconductor layer. Adequate treatment temperatures are no higher than 360° C.

Pressure for nitriding should be no lower than 55 Pa. Nitriding at a pressure lower than 55 Pa is slow and takes a long time to form the nitrogen-oxygen/nitrogen-containing layer that effectively prevents diffusion. A higher pressure is more favorable to nitriding reaction than oxidizing reaction. An adequate pressure is no lower than 60 Pa, preferably no lower than 66 Pa. Incidentally, the upper limit of pressure is not uniquely established because it depends on the apparatus involved. An adequate pressure is no higher than 400 Pa, preferably no higher than 266 Pa, from the standpoint of stable plasma supply.

Duration of plasma irradiation should be no longer than 10 minutes. Plasma irradiation lasting for more than 10 minutes forms the nitrogen-oxygen/nitrogen-containing layer on the surface of amorphous silicon to such an extent as to cause a nonnegligible voltage drop, thereby aggravating the TFT characteristics. An adequate duration of plasma irradiation should be no longer than 7 minutes, preferably no longer than 5 minutes. The minimum duration of plasma irradiation should be no shorter than 1 second, preferably no shorter than 5 seconds, which is enough for at least one atomic layer of the nitrogen-oxygen/nitrogen-containing layer to be formed on the surface of amorphous silicon. One atomic layer is considered to be enough for the effect of the present invention. Examples given later prove that plasma irradiation for about 5 seconds provides sufficient diffusion barrier properties.

The electric power for plasma treatment should be no lower than 50 W. Otherwise, plasma treatment is slow in nitriding reaction and takes a long time to form the nitrogen-containing layer effective as a diffusion barrier. Moreover, it causes oxidizing reactions to proceed faster than nitriding reactions, thereby aggravating the TFT characteristics. Therefore, an adequate electric power should be no lower than 60 W, preferably no lower than 75 W.

The gas for plasma treatment may be any one of the nitrogen-containing gas (such as $N_2$, $NH_3$, and $NF_3$) mentioned above. However, it should preferably be a mixture of a nitrogen-containing gas and a reducing element-containing gas. Such a mixture gas effectively protects the semiconductor layer from oxidation. The reducing gas includes $NH_3$ and $H_2$. $NH_3$ may be used alone (as a reducing gas and a nitrogen-containing gas), but it may also be mixed with $H_2$.

(ii) Thermal Nitriding Method

This method is commonly used because it provides a firmly adhering film. It should be carried out in an atmosphere of nitrogen at temperatures no higher than 400° C. Nitriding at an excessively high temperature heavily damages the semiconductor layer, and nitriding at an excessively low temperature does not form any sufficiently thick nitrogen-oxygen/nitrogen-containing layer. An adequate heating temperature should be no lower than 200° C. and no higher than 380° C., preferably no lower than 250° C. and no higher than 350° C. The thermal nitriding may be used in combination with the plasma nitriding (mentioned above) so as to form the nitrogen-oxygen/nitrogen-containing layer faster.

(iii) Amination Method

This method forms the nitrogen-oxygen/nitrogen-containing layer through decomposition or reaction of gas by optical activity. It usually employs ultraviolet light with a wavelength of about 200-400 nm. The light source for this UV light is a low-pressure mercury lamp (254 nm), high-pressure mercury lamp (365 nm), or excimer laser (ArF: 194 nm and KrF: 248 nm). Amination in an atmosphere of nitrogen should employ short wavelength ultraviolet light which imparts a high energy.

Amination should be carried out with a nitrogen-containing solution, such as the one containing amino groups. Upon irradiation with ultraviolet light, the nitrogen-containing solution efficiently provides nitrogen to the semiconductor layer in contact therewith.

As mentioned above, the nitrogen-oxygen/nitrogen-containing layer should be formed by any of the foregoing three methods (i) to (iii) under properly controlled conditions (temperature, gas composition, apparatus, chamber, etc.) for simple manufacturing procedure and short processing time.

For simple manufacturing procedure, it is desirable to use the same apparatus to form the semiconductor layer and to perform amination. This eliminates the necessity of moving the work in and between the apparatuses.

Amination should be carried out at substantially the same temperature as that at which the semiconductor layer is formed. This saves time for temperature adjustment.

The gas composition should be a mixture of nitrogen-containing gas and reducing gas, as mentioned above, so that the semiconductor layer is protected against oxidation. The reducing element includes $NH_3$ and $H_2$. $NH_3$ may be used alone (as a reducing gas and a nitrogen-containing gas), but it may also be mixed with $H_2$.

The foregoing is a detailed description of the method for forming the nitrogen-oxygen/nitrogen-containing layer.

The nitrogen-oxygen/nitrogen-containing layer, which has been formed on the semiconductor layer of TFT, is subsequently covered with copper alloy by sputtering to form the source-drain wiring. According to the present invention, the source-drain electrodes can be formed with a single sputtering target and a single sputtering gas, which obviates the necessity of altering the composition of the sputtering gas unlike the technology disclosed in Patent Document 11 mentioned above. Therefore, the present invention permits the procedure to be simplified.

According to the present invention, the source-drain electrodes is characterized in having, between the semiconductor layer of TFT and the copper alloy layer, the nitrogen-oxygen/nitrogen-containing layer which covers the semiconductor layer of TFT. Therefore, the semiconductor layer is not specifically restricted in its kind so long as it has no adverse effect on the TFT characteristics; any one that is commonly used for source-drain electrodes can be used.

The semiconductor layer is typically that of amorphous silicon (preferably hydrogenated amorphous silicon) or polycrystalline silicon.

The wiring for the source-drain electrodes may be formed from pure copper which has been in general use.

Alternatively, the wiring for the source-drain electrodes may be formed from copper alloy containing at least one element selected from the group consisting of Ni, Zn, Mg, Mn, Ir, Ge, Nb, Cr, and rare earth elements.

The element selected from the group mentioned above should be used in an amount no less than 0.01 at % and no more than 3 at %. With a content less than 0.01 at %, the copper alloy thin film containing it does not produce the desired effect. With a content more than 3 at %, the copper alloy thin film containing it extremely increases in electric resistance, which makes pixels slow in response, increases power consumption, and deteriorates display quality. A desirable content is no less than 0.05 at % and no more than 2.0 at %.

The thin film transistor substrate provided with the source-drain electrodes mentioned above does not need the lower barrier metal layer interposed between the copper alloy thin film and the semiconductor layer of TFT, unlike the one according to the conventional technology. Therefore, the copper alloy thin film can be joined to the semiconductor layer through the nitrogen-containing layer or oxygen/nitrogen-containing layer. It has been proved in Examples given later that the TFT with pure copper or copper alloy thin film is superior in TFT characteristics to the conventional TFT having a barrier metal layer of Cr. Therefore, the present invention leads to a simplified manufacturing process and cost reduction through the omission of the barrier metal layer.

Preferred embodiments of the present invention for the TFT module will be described below with reference to the accompanying drawings. The embodiments given below are concerned mainly with a liquid crystal display device equipped with the amorphous silicon TFT substrate. However, they are not intended to restrict the scope of the present invention; they may be properly changed and modified within the scope of the present invention. Such changes and modifications are covered by the present invention. It has been experimentally proved that the source-drain electrodes used in the present invention may also be applied to the reflecting electrode for liquid crystal display device of reflection type and the TAB connecting electrode for signal exchange with outside units.

Embodiment 1

Figure 3:
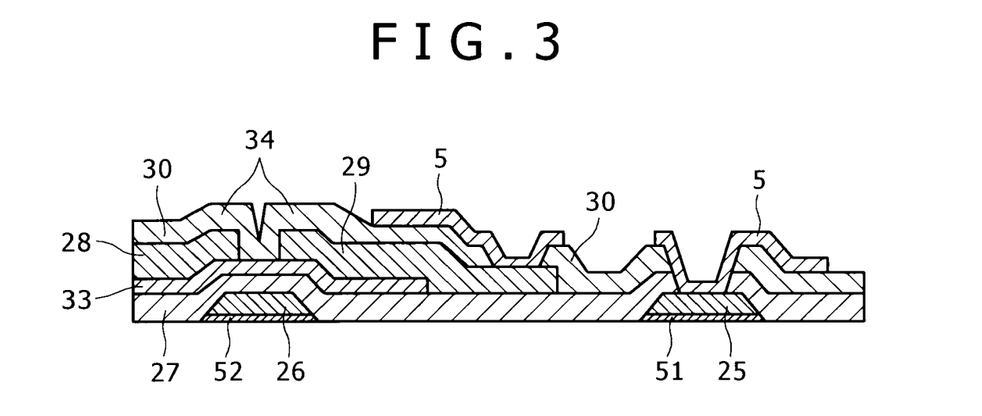
FIG. 3 is a schematic sectional view showing the structure of a TFT substrate pertaining to an embodiment of the present invention.

FIG. 3 is a schematic sectional view showing the structure of the amorphous silicon TFT substrate pertaining to an embodiment of the present invention. The reference numerals for the conventional TFT substrate in FIG. 2 are also used in FIG. 3. This embodiment proved the formation of the oxygen/nitrogen-containing layer, as detailed below.

In FIG. 3, the source electrode 28 and the drain electrode 29 are electrically connected to the source-drain wiring 34, which is composed of an oxygen/nitrogen-containing layer and copper or copper alloy containing 0.34 at % Ni. The oxygen-nitrogen-containing layer is so formed as to cover the amorphous silicon channel thin film 33. The structure of the source-drain wiring 34 is shown in FIGS. 4(e) and 4(f) given later.

It is apparent from comparison between FIG. 2 and FIG. 3 that the conventional TFT substrate (shown in FIG. 2) has the lower barrier metal layer 53 of Mo under the source-drain electrode, whereas the TFT module according to the present invention does not.

This embodiment is unique in that the copper alloy is connected directly to the amorphous silicon channel thin film with the oxygen/nitrogen-containing layer interposed between them but without the lower barrier metal layer interposed between them unlike the conventional technology. This structure produces as good TFT characteristics as the conventional TFT substrate. (See Examples given later.)

The TFT substrate (shown in FIG. 3) pertaining to this embodiment is produced by the process which is described below with reference to FIG. 4. FIGS. 3 and 4 use the same reference numerals.

Figure 4A:
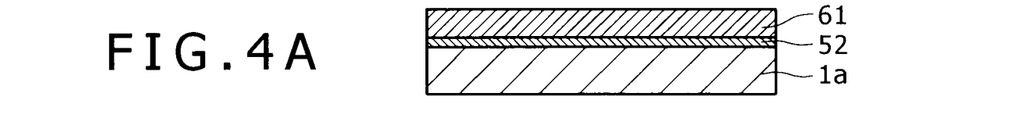
FIG. 4 is a diagram showing part of the manufacturing process for the TFT substrate shown in FIG. 3.
Figure 4B:
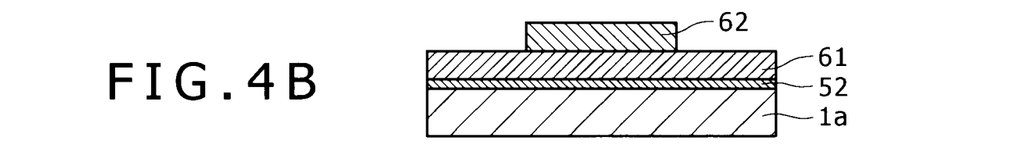
Figure 4C:
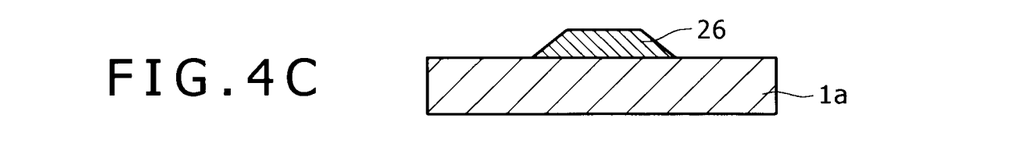

The first step shown in FIG. 4(a) is to coat the glass substrate 1a by sputtering sequentially with the Mo thin film 52 (about 50 nm thick) and the Cu alloy thin film 61 containing 0.34 at % Ni (about 200 nm thick). Sputtering is carried out at room temperature. The thin film 61 is coated with the photoresist 62, which is subsequently patterned by photolithography as shown in FIG. 4(b). Then, the Mo thin film 52 and the Cu alloy thin film 61 undergo etching through the photoresist 62 as a mask, so that the gate electrode 26 is formed as shown in FIG. 4(c). Etching should be carried out in such a way that the periphery of the thin films has a slope of about 30°-60°, so that the gate electrode 26 is smoothly covered by the gate insulating film 27 in the subsequent step.

Figure 4D:
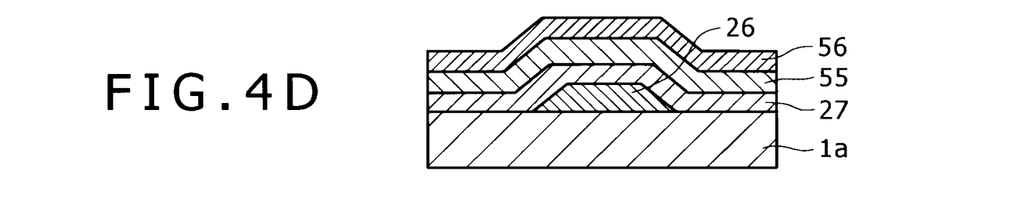
Figure 4E:
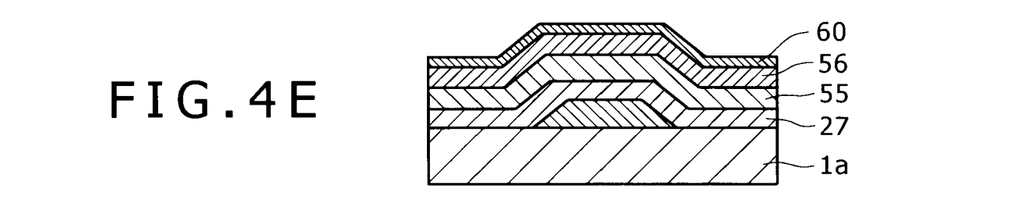
Figure 4F:
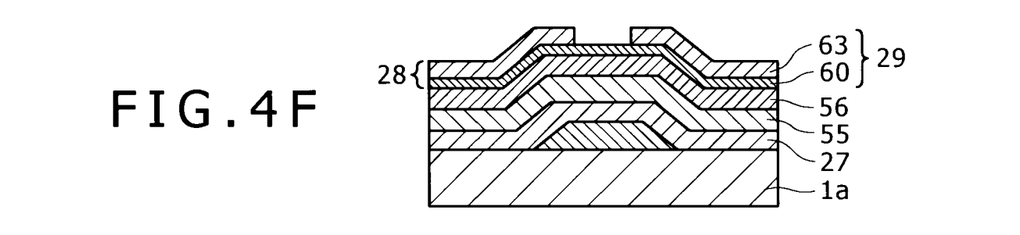

In the next step, the silicon nitride film or gate insulating film 27 (about 300 nm thick) is formed by plasma CVD or the like, as shown in FIG. 4(d). Plasma CVD is carried out at about 350° C. Then, the silicon nitride film or gate insulating film 27 is coated sequentially with the undoped hydrogenated amorphous silicon film (a-Si—H) 55, about 200 nm thick, and the P-doped n$^+$-type hydrogenated amorphous silicon film (n$^+$a-Si—H) 56, about 80 nm thick, by plasma CVD or the like. The n$^+$-type hydrogenated amorphous silicon film can be formed from and $PH_3$ by plasma CVD.

The n$^+$-type hydrogenated amorphous silicon film (n$^+$a-Si—H) 56, which has been formed in the previous step, is coated with the oxygen/nitrogen-containing layer 60 by using the same plasma CVD apparatus as used to form the Si nitride film. Specifically, this step is carried out as follows. The chamber holding therein the substrate is freed of the raw material gas used to form the amorphous silicon film. The chamber is supplied with nitrogen only (as a carrier gas) for plasma treatment for 30 seconds on the surface of the n⁺-type hydrogenated amorphous silicon film 56, so that the oxygen/nitrogen-containing layer is formed. The RF power density is 0.14 W/cm$^2$, the film-forming temperature is 320° C., and the gas pressure is 133 Pa.

The experimental sample prepared under the foregoing conditions was examined for TFT characteristics in Example 1 given later. The results of analysis by RBS and XPS indicate that the upper layer (about 3.0 nm thick) of the oxygen/nitrogen-containing layer contains oxygen atoms such that the Q value is larger than 0.2. (The Q values is a ratio of the total number of oxygen atoms and nitrogen atoms to the number of silicon atoms.) The reason why the oxygen/nitrogen-containing layer appears even though only nitrogen (as a carrier gas) is employed is that oxygen atoms adsorbed to the inner wall of the chamber and pipe release themselves and inevitably enter the nitrogen-containing layer at the time of plasma nitriding in the plasma CVD chamber.

Incidentally, in this embodiment, the oxygen/nitrogen-containing layer 60 was formed by the plasma nitriding method. However, it was experimentally proved that the oxygen/nitrogen-containing layer or the nitrogen-containing layer substantially free of oxygen can be formed by the thermal nitriding method (ii) or the amination method (iii) mentioned above.

The oxygen/nitrogen-containing layer 60 is subsequently coated by sputtering with the copper alloy film 63 containing 0.34 at % Ni (about 300 nm thick), as shown in FIG. 4(*f*). Sputtering is performed at room temperature. The copper alloy film 63 undergoes etching through a resist mask patterned by photolithography. Thus, the source electrode 28 and the drain electrode 29 are formed. See FIG. 4(*f*). The n⁺-type hydrogenated amorphous silicon film 56 is removed by dry etching through the source electrode 28 and the drain electrode 29 as a mask. See FIG. 4(*g*).

A silicon nitride film as a protective film, about 300 nm thick (not shown), is formed at about 250° C. by using a plasma nitriding apparatus. A photoresist is patterned on the silicon nitride film 30, and dry etching through the photoresist is performed to form the contact hole 57.

The photoresist layer (not shown) is removed by using an amine-based removing solution. Finally, an ITO film (composed of indium oxide and 10 mass % of tin oxide), about 50 nm thick, is formed. The ITO film is patterned by wet etching to form the transparent pixel electrode 5. In this way the TFT is completed.

The TFT substrate according to this embodiment is constructed such that the amorphous silicon channel thin film is connected to the Cu—Ni alloy thin film with the nitrogen-oxygen/nitrogen-containing film interposed between them.

The transparent pixel electrode 5 may be formed from IZO film in place of ITO film mentioned above. Also, amorphous silicon for the active semiconductor layer may be replaced by polycrystalline silicon.

The TFT substrate obtained as mentioned above is made into the liquid crystal display device shown in FIG. 1 by the following method.

The surface of the TFT substrate 1 is coated with polyimide, and the coating film undergoes rubbing after drying, so that the alignment layer is formed.

The opposite substrate 2 is formed from a glass plate by forming thereon the light shielding films 9 of chromium in a matrix pattern. The gaps between the light shielding films 9 are filled with the resin color filters 8 in red, green, and blue. The light shielding films 9 and the color filters 8 are coated with a transparent conductive film of ITO as the common electrode 7. In this way, the opposite electrode is formed. The uppermost layer of the opposite electrode is coated with polyimide and the polyimide coating undergoes rubbing after drying, so that the alignment layer 11 is formed.

The TFT substrate 1 and the opposite substrate 2 are arranged such that their alignment layers face each other. They are bonded together with a sealing material 16 of resin, with the port for liquid crystal left open. Their gap is kept almost constant by spacers 15 placed between them.

The empty cell thus obtained is placed in an evacuated vessel, and the pressure in the vessel is gradually raised to normal pressure, so that the empty cell is filled with liquid crystal, and the port is sealed. Finally, both sides of the filled cell are covered with the polarizer 10. In this way the liquid crystal panel is completed.

The liquid crystal panel is electrically connected to the driver circuit 13 that drives the liquid crystal display device. The driver circuit 13 is placed on the side or rear of the liquid crystal panel. The liquid crystal panel provided with the back light 22 and the light guide plate 20 is supported by the frame 23 which has the opening for the display surface of the liquid crystal panel. Thus, the liquid crystal display device is completed.

The present invention also covers the sputtering target of copper alloy which is used to form the source-drain electrodes mentioned above.

The source-drain electrodes are formed from pure copper thin film or copper alloy thin film as mentioned above in Embodiment, and the thin film should be formed by sputtering suitable for high-quality film and high-speed deposition. This object is achieved by using the sputtering target of pure copper or copper alloy.

The sputtering target mentioned above may be produced by any method without specific restrictions, such as melting-casting and powder sintering. A recommended method is vacuum melting-casting. This method yields sputtering targets containing less impurities (such as nitrogen and oxygen) than those produced by other methods. Such sputtering targets give rise to the source-drain electrodes with good characteristics, which enables production of display devices of high performance and high reliability.

Since the display device according to the present invention has the source-drain electrodes mentioned above, it exhibits by far superior performance and reliability. The display device according to the present invention suffices so long as it has the source-drain electrodes mentioned above. It may be constructed in any manner which is used for known display devices.

EXAMPLES

Examples 1 and 2, and Comparative Example 1

Examples 1 and 2 that follow involve experiments to prove that the source-drain electrodes of copper alloy thin film having an oxygen/nitrogen-containing layer, with a barrier metal layer omitted, prevents the diffusion of copper into the semiconductor layer, thereby giving good TFT properties. These examples employed the plasma nitriding method to form the oxygen/nitrogen-containing layer as in Embodiment 1 mentioned above. The details of experiment conditions and evaluation methods are given below.

(Source-Drain Electrodes)

In Example 1, the wiring for the source-drain electrodes was formed from copper alloy containing 0.34 at % Ni mentioned in Embodiment 1 above.

In Example 2, the copper alloy containing 0.34 at % Ni mentioned in Embodiment 1 was replaced by pure copper.

In Comparative Example 1, pure copper was used without nitrogen plasma treatment.

It was found in Examples 1 and 2 that the nitrogen-containing layer has an oxygen/nitrogen-containing layer (about 3.0 μm thick) and that the oxygen/nitrogen-containing layer has the Q value in excess of 0.2 as indicated by RBX analysis. (The Q value is a ratio of the total number of nitrogen atoms and oxygen atoms to the number of silicon atoms.)

By contrast, it was found in Comparative Example 1 that no nitrogen-oxygen/nitrogen-containing layer occurred.

(TFT Used for Experiments)

Figure 4G:
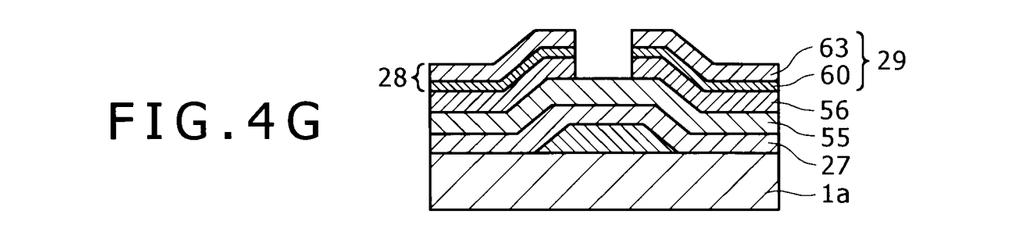

The TFT shown in FIG. 4(g) in Embodiment was examined for TFT characteristics after heat treatment at varied temperatures (150° C., 200° C., 250° C., and 300° C.) for 30 minutes. This heat treatment condition simulates the heating history which the TFT substrate would encounter when the silicon nitride film (or protective film) is formed in its manufacturing process. The TFT substrate tested in this example is not an actual one which is completed by various film-forming steps; however, it is considered that the TFT substrate annealed as mentioned above has almost the same TFT characteristics as those of an actual TFT.

(Evaluation of Mutual Diffusion of Silicon and Copper)

In each of Examples 1 and 2 and Comparative Example 1, the TFT shown in FIG. 4(g) according to Embodiment was prepared and examined to see if mutual diffusion occurs between silicon and copper at the interface of the amorphous silicon channel thin film.

To achieve the object, TFT samples, with or without heat treatment at 350° C. for 30 minutes in an atmosphere of nitrogen, were analyzed by GD-DES to determine elements in the depthwise direction. To analyze the film by GD-DES, the sample is subjected to high-frequency sputtering which scrapes down the film. GD-DES analysis was carried out under the following conditions.

Gas pressure: 300 Pa, electric power: 20 W, frequency: 500 Hz, and duty cycle: 0.125.

(Result of Evaluation of Mutual Diffusion of Silicon and Copper)

The results of GD-DES analysis are shown in FIG. 5 (for Comparative Example 1 with pure copper), FIG. 6 (for Example 1) and FIG. 7 (for Example 2).

The results shown in FIG. 5 (for Comparative Example 1) are reviewed below.

Figure 5A:
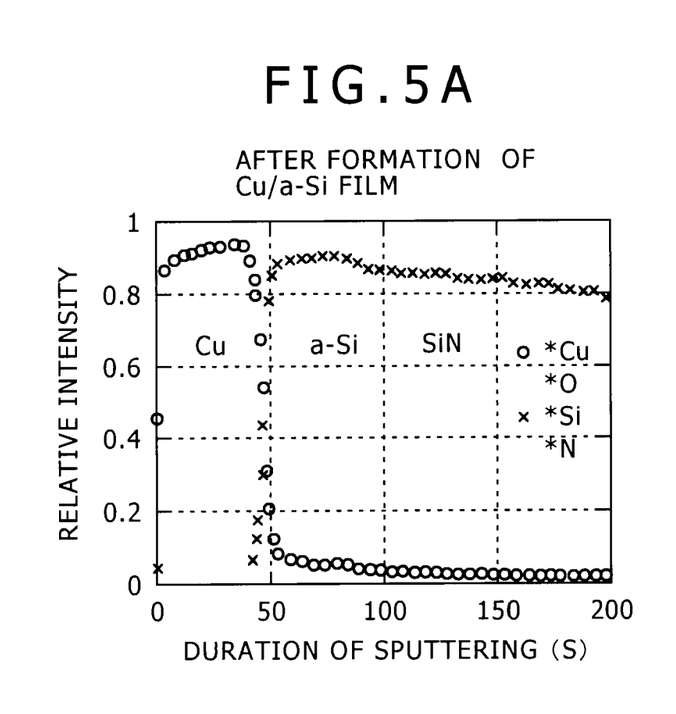
FIG. 5 is a diagram showing the results of GD-OES analysis for Comparative Example 1.
Figure 5B:
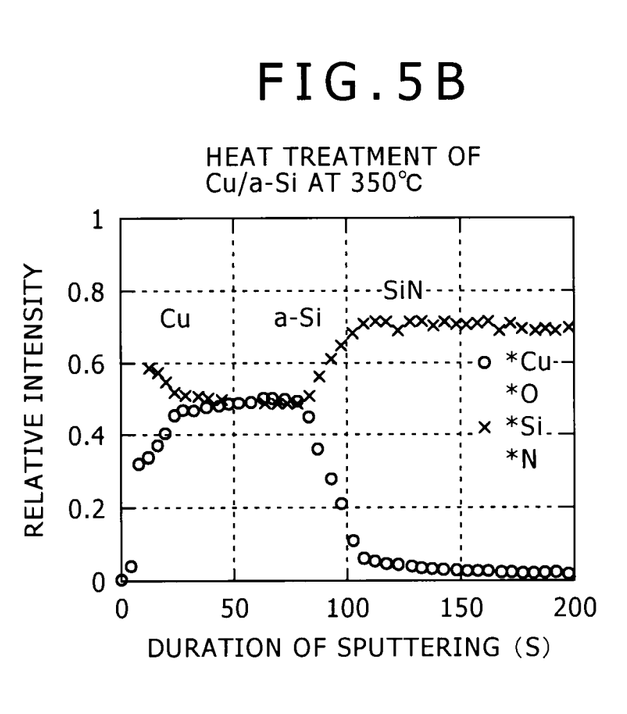

Data in FIG. 5(a) represent the sample immediately after preparation, and data in FIG. 5(b) represent the sample which has undergone heat treatment at 350° C. for 30 minutes. The abscissa indicates the duration of sputtering (in seconds), which is indirectly equivalent to the distance in the depthwise direction from the surface. The ordinate indicates the relative intensity of Cu atoms, O atoms, Si atoms, and N atoms.

It is apparent from comparison between FIG. 5(a) and FIG. 5(b) that the sample in Comparative Example 1 (which does not have the nitrogen-oxygen/nitrogen-containing layer) allows diffusion of copper atoms into amorphous silicon (a-Si).

The results shown in FIGS. 6 and 7 (for Examples 1 and 2) are reviewed below.

Figure 6A:
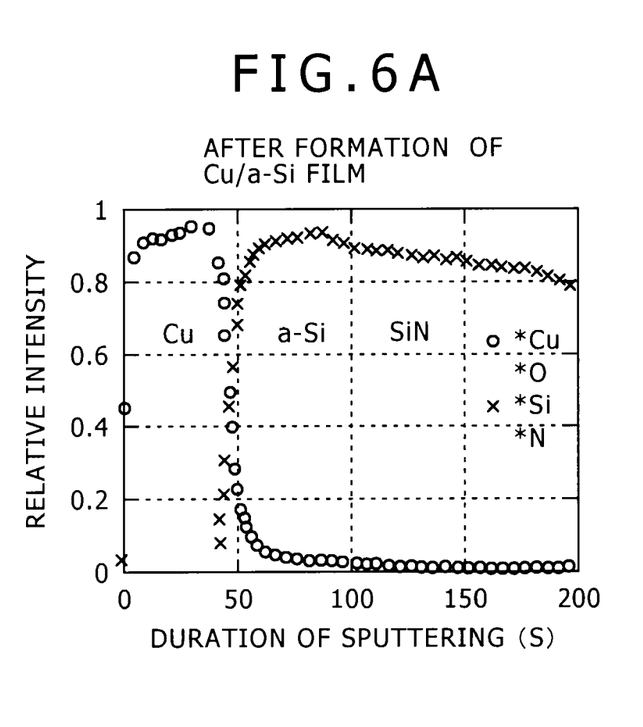
FIG. 6 is a diagram showing the result of GD-OES analysis for Example 1.
Figure 6B:
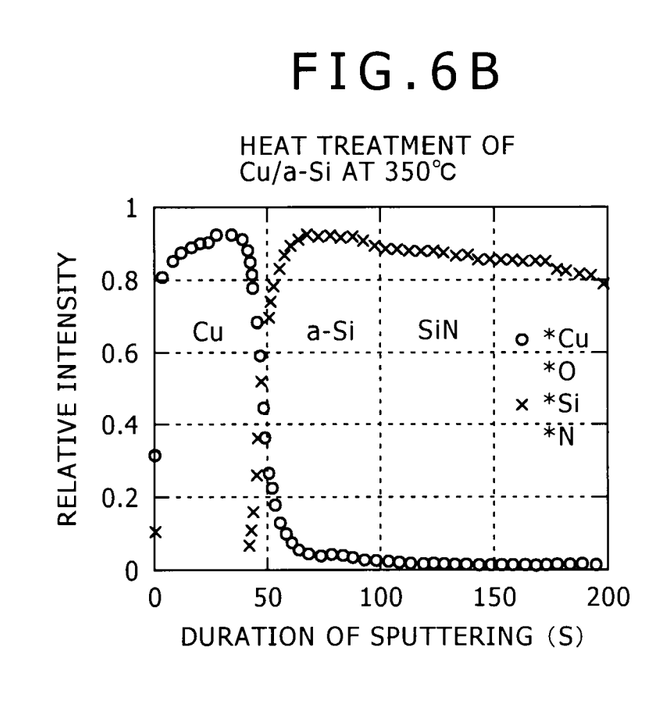
Figure 7A:
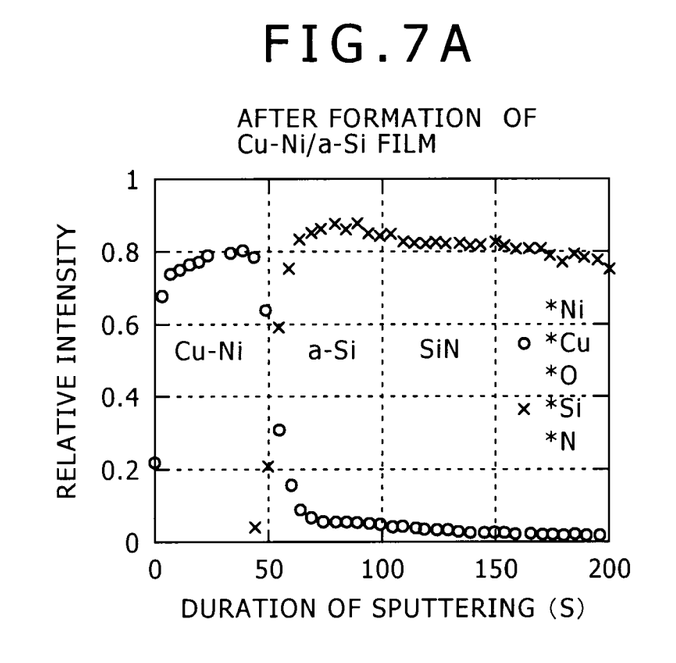
FIG. 7 is a diagram showing the result of GD-OES analysis for Example 2.
Figure 7B:
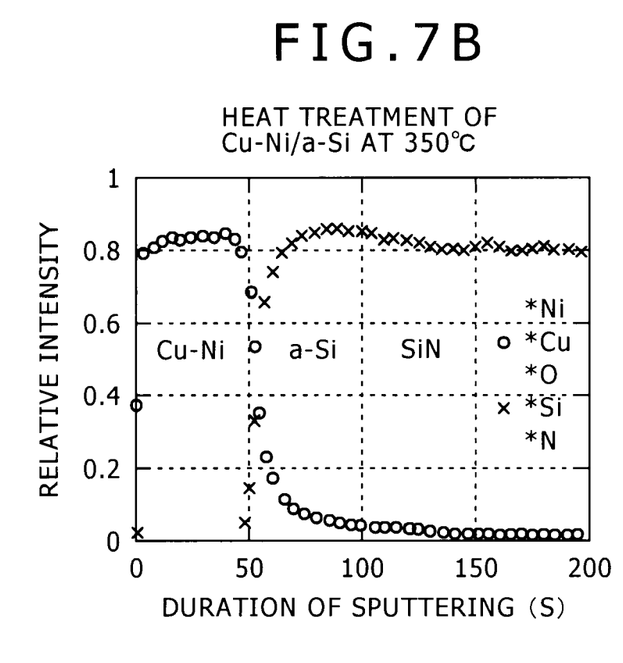

It is apparent from comparison between FIG. 6(a) and FIG. 6(b) and between FIG. 7(a) and FIG. 7(b) that the sample with copper alloy containing 0.34 at % Ni in Example 1 (having the oxygen/nitrogen-containing layer) and the sample with pure copper in Example 2 (having the oxygen/nitrogen-containing layer) do not allow diffusion of copper atoms into amorphous silicon (a-Si).

It was experimentally found that the same results as in FIGS. 6 and 7 are obtained even when the Cu—Ni alloy is replaced by any copper alloy with Ni replaced by at least one species of Ni, Zn, Mg, Mn, Ir, Ge, Nb, Cr, and rare earth elements.

Example 3

In this example, the same procedure as in Example 1 was repeated to prepare TFT samples except that the plasma nitriding method used in Example 2 (with pure copper) was used under various five conditions shown in Table 1 to form the oxygen/nitrogen-containing layer. The resulting TFT samples underwent heat treatment in various manners as in Example 1. For the purpose of comparison, some TFT samples did not undergo heat treatment. All the experiments employed nitrogen as a carrier gas.

In Table 1, conditions 1, 2, 4, and 5 are applied to plasma nitriding according to the present invention and condition 3 is applied to nitriding by plasma irradiation extended to 600 seconds.

The TFT samples mentioned above were examined for switching characteristics in terms of drain current due to gate voltage. Switching characteristics are a measure that indirectly indicates mutual diffusion of silicon and copper. Off current and on current were measured in the following manner. (Off current or leakage current is drain current that flows when TFT is turned off or a negative voltage is applied to the gate voltage. On current is drain current that flows when TFT is turned on.)

A TFT sample having a gate length (L) of 300 μm and a gate with (W) of 20 μm is measured for drain current and gate voltage. The drain voltage at the time of measurement is 10 V. The off current is defined as a current that flows when a gate voltage (−3 V) is applied, and the on current is defined as a voltage that flows when the gate voltage is 20 V.

The TFT characteristics measured as mentioned above are compared with the standard values of the conventional TFT in the following manner. A sample of conventional TFT is prepared in the same way as mentioned above in which the source-drain electrodes are composed of pure copper thin film and barrier metal layer of molybdenum, and this sample is examined for TFT characteristics. It was found that the conventional TFT has an on current of about $1\times10^{-6}$ A (or of the order of μA) and an off current of about $1\times10^{-12}$ A (or of the order of pA). The samples are rated as good (○) if the off current is lower than $1\times10^{-11}$ A (or the increase in off current is within one order of the reference value) and as poor (x) if the off current increases more than the specified limit. The samples are also rated as good (○) if the on current exceeds the reference value ($1\times10^{-6}$ A) after heat treatment and as poor (x) if the on current decreases below the reference value. The samples are given an overall rating as good (○) if they are good in both on current and off current, and they are given an overall rating as poor (x) if either on current or off current is good or poor.

TFT samples were prepared under conditions 1, 3, and 5 shown in Table 1. They were examined for the Q value and thickness of the oxygen/nitrogen-containing layer by using a high-dissolution RBS analyzer "HRBS500" made by Kobe Steel Co., Ltd. The thickness of the oxygen/nitrogen-containing layer is that for which the Q value is higher than 0.2.

The results are shown in Table 2.

TABLE 1

| Condition | Heating temperature (° C.) | Pressure (Pa) | Power (W) | Duration (seconds) |
|---|---|---|---|---|
| 1 | 320 | 133 | 100 | 5 |
| 2 | 320 | 250 | 100 | 60 |
| 3 | 320 | 133 | 100 | 600 |
| 4 | 320 | 133 | 50 | 60 |
| 5 | 320 | 133 | 100 | 30 |

TABLE 2

| Condition | Heat treatment | On current Measured value (μA) | Rating | Off current Measured value (pA) | Rating | Overall rating |
|---|---|---|---|---|---|---|
| 1 | none | 1.66 | ○ | 0.67 | ○ | ◎ |
|   | 150° C. | 1.93 | ○ | 0.25 | ○ | ◎ |
|   | 200° C. | 1.92 | ○ | 0.37 | ○ | ◎ |
|   | 250° C. | 1.86 | ○ | 0.13 | ○ | ◎ |
|   | 300° C. | 1.81 | ○ | 1.20 | ○ | ◎ |
| 2 | none | 1.92 | ○ | 0.57 | ○ | ◎ |
|   | 150° C. | 2.23 | ○ | 2.1 | ○ | ◎ |
|   | 200° C. | 2.15 | ○ | 2.07 | ○ | ◎ |
|   | 250° C. | 2.21 | ○ | 0.18 | ○ | ◎ |
|   | 300° C. | 1.90 | ○ | 0.07 | ○ | ◎ |
| 3 | none | 0.35 | X | 0.69 | ○ | X |
|   | 150° C. | 0.33 | X | 1.02 | ○ | X |
|   | 200° C. | 0.29 | X | 1.60 | ○ | X |
|   | 250° C. | 0.24 | X | 0.63 | ○ | X |
|   | 300° C. | 0.22 | X | 0.11 | ○ | X |
| 4 | none | 1.44 | ○ | 0.30 | ○ | ◎ |
|   | 150° C. | 1.48 | ○ | 0.37 | ○ | ◎ |
|   | 200° C. | 1.52 | ○ | 0.99 | ○ | ◎ |
|   | 250° C. | 1.87 | ○ | 4.08 | ○ | ◎ |
|   | 300° C. | 1.63 | ○ | 0.46 | ○ | ◎ |
| 5 | none | 1.94 | ○ | 0.30 | ○ | ◎ |
|   | 150° C. | 2.08 | ○ | 1.54 | ○ | ◎ |
|   | 200° C. | 2.13 | ○ | 1.21 | ○ | ◎ |
|   | 250° C. | 2.46 | ○ | 1.15 | ○ | ◎ |
|   | 300° C. | 2.17 | ○ | 0.18 | ○ | ◎ |

The following conclusion follows from Table 2.

Samples prepared by plasma nitriding under conditions 1, 2, 4, and 5 (regarded as adequate in the present invention) are numbered 1-5, 6-10, 16-20, and 21-25, respectively. These samples exhibit as good TFT characteristics as conventional ones even though they undergo heat treatment.

Plasma nitriding under condition 1 gave a Q value of 1.8 and formed an oxygen/nitrogen-containing layer with a thickness of 1.7 nm. Also, plasma nitriding under condition 5 gave a Q value of 1.5 and formed an oxygen/nitrogen-containing layer with a thickness of 2.0 nm. Plasma nitriding under both conditions formed the oxygen/nitrogen-containing layer that produces the effect of preventing diffusion as desired.

The oxygen/nitrogen-containing layer formed by plasma nitriding under condition 1 was analyzed by RBS. It was found that the areal density of oxygen and nitrogen on the uppermost layer is $1.2 \pm 0.4 \times 10^{15}$ (atoms/cm$^2$) and $10.9 \pm 0.5 \times 10^{15}$ (atoms/cm$^2$), respectively. The ratio of nitrogen to oxygen is approximately 9:1. The depthwise profiling by RBS analysis indicates that the peak of nitrogen concentration and oxygen concentration is 58 at % and 30 at %, respectively. The foregoing suggests that plasma nitriding under condition 1 causes the nitrogen-containing layer to contain oxygen in a specific amount as mentioned above; however, it is apparent from the foregoing experiments that the thus contained oxygen has no adverse effect on TFT characteristics.

Condition 3 represents plasma nitriding for extended irradiation. The resulting samples Nos. 11 to 15 have a low on current as shown in Table 2.

Also, plasma nitriding under condition 3 gave a Q value of 1.4 and formed an oxygen/nitrogen-containing layer with a thickness of 3.7 nm. This thickness is larger than that specified in the present invention.

The foregoing results suggest that the TFT with the source-drain electrodes formed by plasma nitriding under the specific condition according to the present invention exhibits good TFT characteristics because it prevents mutual diffusion of silicon and copper at the interface between the amorphous silicon channel thin film and the copper alloy thin film even though the barrier metal layer is omitted.

Example 4

In this example, the same procedure as in Example 1 was repeated to prepare TFT samples except that the source-drain electrodes employ copper alloy (containing any one of Ni, Zn, Mn, Mg, and Ge) in place of pure copper (as in Example 2) and that plasma nitriding was performed under the following condition. The resulting TFT samples underwent heat treatment under varied conditions in the same way as in Example 1. For the purpose of comparison, some TFT samples did not undergo heat treatment. For the purpose of reference, the same experiment as above was conducted with the source-drain electrodes that employ pure copper.

Plasma Condition

Temperature: 320° C., pressure: 133 Pa, electric power: 100 W, duration of irradiation: 60 seconds, carrier gas: nitrogen.

The TFT samples mentioned above were rated by measuring drain current and gate voltage in the same way as in Example 3.

The results are shown in Tables 3A and 3B.

TABLE 3A

| Source-drain electrodes | Heat treatment | On current Measured value (μA) | Rating | Off current Measured value (pA) | Rating | Overall rating |
|---|---|---|---|---|---|---|
| Pure copper | none | 1.92 | ○ | 0.57 | ○ | ◎ |
|   | 150° C. | 2.23 |   | 2.10 |   | ◎ |
|   | 200° C. | 2.15 |   | 2.07 |   | ◎ |
|   | 250° C. | 2.21 |   | 0.18 |   | ◎ |
|   | 300° C. | 1.90 |   | 0.07 |   | ◎ |
| Cu-0.34 at % Ni | none | 2.08 | ○ | 1.02 | ○ | ◎ |
|   | 150° C. | 2.14 |   | 0.49 |   | ◎ |
|   | 200° C. | 2.25 |   | 0.87 |   | ◎ |
|   | 250° C. | 2.27 |   | 0.36 |   | ◎ |
|   | 300° C. | 2.30 |   | 1.42 |   | ◎ |
| Cu-1.3 at % Zn | none | 1.80 | ○ | 0.81 | ○ | ◎ |
|   | 150° C. | 1.93 |   | 0.75 |   | ◎ |
|   | 200° C. | 2.05 |   | 1.56 |   | ◎ |
|   | 250° C. | 2.12 |   | 2.02 |   | ◎ |
|   | 300° C. | 2.20 |   | 0.14 |   | ◎ |
| Cu-0.5 at % Mn | none | 1.98 | ○ | 1.04 | ○ | ◎ |
|   | 150° C. | 2.01 |   | 0.76 |   | ◎ |
|   | 200° C. | 2.26 |   | 0.81 |   | ◎ |
|   | 250° C. | 2.28 |   | 0.64 |   | ◎ |
|   | 300° C. | 2.24 |   | 0.37 |   | ◎ |
| Cu-1.0 at % Mg | none | 2.13 | ○ | 0.92 | ○ | ◎ |
|   | 150° C. | 2.20 |   | 1.24 |   | ◎ |
|   | 200° C. | 2.27 |   | 2.56 |   | ◎ |
|   | 250° C. | 2.29 |   | 2.13 |   | ◎ |
|   | 300° C. | 2.24 |   | 0.27 |   | ◎ |

TABLE 3B

| Source-drain electrodes | Heat treatment | On current Measured value (μA) | Rating | Off current Measured value (pA) | Rating | Overall rating |
|---|---|---|---|---|---|---|
| Cu-0.2 at % Ga | none | 1.74 | ○ | 0.81 | ○ | ◎ |
| | 150° C. | 1.94 | | 1.16 | | ◎ |
| | 200° C. | 2.31 | | 1.43 | | ◎ |
| | 250° C. | 2.38 | | 1.04 | | ◎ |
| | 300° C. | 2.17 | | 0.79 | | ◎ |
| Cu-0.2 at % Ge-0.3 at % Ni | none | 1.94 | ○ | 0.42 | ○ | ◎ |
| | 150° C. | 2.08 | | 0.64 | | ◎ |
| | 200° C. | 2.44 | | 0.68 | | ◎ |
| | 250° C. | 2.40 | | 0.28 | | ◎ |
| | 300° C. | 2.06 | | 1.03 | | ◎ |
| Cu-0.5 at % Mn-0.2 at % Ge | none | 1.71 | ○ | 1.40 | ○ | ◎ |
| | 150° C. | 2.24 | | 0.71 | | ◎ |
| | 200° C. | 2.37 | | 1.16 | | ◎ |
| | 250° C. | 2.34 | | 1.43 | | ◎ |
| | 300° C. | 2.25 | | 1.32 | | ◎ |
| Cu-0.5 at % Mn-0.3 at % Ni | none | 1.75 | ○ | 0.63 | ○ | ◎ |
| | 150° C. | 1.94 | | 2.44 | | ◎ |
| | 200° C. | 2.12 | | 1.57 | | ◎ |
| | 250° C. | 2.44 | | 1.20 | | ◎ |
| | 300° C. | 2.26 | | 1.37 | | ◎ |

It is noted from Tables 3A and 3B that all the samples are as good in TFT characteristics as the samples with pure copper or Cu—Ni alloy even though the Cu—Ni alloy is replaced by any one of Cu—Zn alloy, Cu—Mn alloy, Cu—Mg alloy, Cu—Ge alloy, Cu—Ge—Ni alloy, Cu—Mn—Ge, and Cu—Mn—Ni alloy.

It is further understood by those skilled in the art that the foregoing description is a preferred embodiment of the disclosed device and various changes and modifications may be made in the invention without departing from the sprit and scope thereof. The present application is based on Japanese Patent Application (No. 2006-280532) filed Oct. 13, 2006, which may be referenced therein. All of the references cited herein constitute the present invention.

EXPLOITATION IN INDUSTRY

The thin film transistor substrate according to the present invention provides good TFT characteristics even though the barrier metal layer is not formed between the source-drain electrodes and the TFT semiconductor layer unlike the conventional one.

The invention claimed is:

1. A substrate supporting thin film transistors thereon, comprising:
   said transistors each having a semiconductor layer and source-drain electrodes,
   said semiconductor layer comprising a single silicon layer including a transistor channel;
   said source-drain electrodes having a thin film of pure copper or copper alloy;
   a nitrogen-containing layer or an oxygen/nitrogen-containing layer comprising a plasma-reacted surface layer in silicon in the single silicon layer of the thin film transistor that has respectively part or all of its nitrogen or part or all of its oxygen or nitrogen connected to the silicon in said single silicon layer of said thin film transistor; and
   said thin film of pure copper or copper alloy connected with said single silicon layer of said thin film transistor only through said nitrogen-containing layer or oxygen/nitrogen-containing layer in said silicon in the single silicon layer of the thin film transistor,
   wherein the single silicon layer includes both
   1) said channel, and
   2) said nitrogen-containing layer or oxygen/nitrogen-containing layer comprising said plasma-reacted surface layer.

2. The substrate supporting thin film transistors thereon as defined in claim 1, wherein the nitrogen-containing layer contains nitrogen such that the ratio of the number of nitrogen atoms to the number of silicon atoms is no smaller than 0.2 and no larger than 2.0, and said oxygen/nitrogen-containing layer contains oxygen and nitrogen such that the ratio of the total number of oxygen atoms and nitrogen atoms to the number of silicon atoms is no smaller than 0.2 and no larger than 2.0.

3. The substrate supporting thin film transistors thereon as defined in claim 2, wherein the nitrogen-containing layer or oxygen/nitrogen-containing layer has a thickness no smaller than 0.8 nm and no larger than 3.5 nm.

4. The substrate supporting thin film transistors thereon as defined in claim 1, wherein the semiconductor layer of the thin film transistor is formed from amorphous silicon or polycrystalline silicon.

5. The substrate supporting thin film transistors thereon as defined in claim 4, further comprising a display device connected to said transistors.

* * * * *